US012563950B2

(12) United States Patent
Hu

(10) Patent No.: US 12,563,950 B2
(45) Date of Patent: Feb. 24, 2026

(54) DISPLAY PANEL AND MANUFACTURING METHOD THEREOF

(71) Applicant: Shenzhen China Star Optoelectronics Semiconductor Display Technology Co., Ltd., Guangdong (CN)

(72) Inventor: Siwei Hu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 378 days.

(21) Appl. No.: 18/325,807

(22) Filed: May 30, 2023

(65) Prior Publication Data

US 2024/0065076 A1 Feb. 22, 2024

(30) Foreign Application Priority Data

Aug. 18, 2022 (CN) .......................... 202210993016.1

(51) Int. Cl.
*H10K 59/80* (2023.01)
*G09G 3/3266* (2016.01)
(Continued)

(52) U.S. Cl.
CPC ......... *H10K 59/873* (2023.02); *G09G 3/3266* (2013.01); *H10K 59/874* (2023.02); *H10K 71/00* (2023.02); *H10K 2102/331* (2023.02)

(58) Field of Classification Search
CPC .... H10K 59/873; H10K 59/874; H10K 71/00; H10K 2102/331; H10K 59/8722; G09G 3/3266
See application file for complete search history.

(56) References Cited

U.S. PATENT DOCUMENTS 4,081,397 A * 3/1978 Booe ..................... C09K 3/1021
524/925
11,342,532 B2 * 5/2022 Liu ....................... H10K 59/124
(Continued)

FOREIGN PATENT DOCUMENTS

| CN | 104347814 A | 2/2015 |
| CN | 112563432 A | 3/2021 |
| KR | 20190007983 A | 1/2019 |

OTHER PUBLICATIONS

Chinese Office Action issued in corresponding Chinese Patent Application No. 202210993016.1 dated Apr. 26, 2025, pp. 1-8.

*Primary Examiner* — Caleb E Henry
(74) *Attorney, Agent, or Firm* — PV IP PC; Christopher S. Ruprecht; Wei Te Chung

(57) ABSTRACT

A display panel includes a substrate and an encapsulation cover plate which are arranged opposite to each other, a driving circuit layer and a light emitting device layer which are sequentially arranged on one side of the substrate close to the encapsulation cover plate, and a dam interposed between the substrate and the encapsulation cover plate. The display panel has a display area and a non-display area arranged around the display area. The light emitting device layer is located in the display area, the driving circuit layer is located in the display area and the non-display area, and the dam is located in the non-display area and arranged around the display area. The dam partially overlaps with the driving circuit layer located in the non-display area. A manufacturing method of the display panel is also provided.

15 Claims, 2 Drawing Sheets

(51) Int. Cl.
    *H10K 71/00*         (2023.01)
    *H10K 102/20*      (2023.01)
    *H10K 102/00*      (2023.01)

(56)           References Cited

U.S. PATENT DOCUMENTS

| | | | |
|---|---|---|---|
| 11,489,026 B2 * | 11/2022 | Ding | H10K 59/122 |
| 11,569,320 B2 * | 1/2023 | You | H10K 59/65 |
| 11,588,001 B2 * | 2/2023 | Seo | H10K 59/131 |
| 2010/0163859 A1 * | 7/2010 | Yamazaki | H10K 59/873 |
| | | | 257/40 |
| 2012/0074408 A1 * | 3/2012 | Moon | H01L 24/05 |
| | | | 438/34 |
| 2019/0157618 A1 | 5/2019 | Park et al. | |
| 2021/0305535 A1 * | 9/2021 | Zhang | H10K 59/38 |

* cited by examiner

1'          7'     6'     8'     5'     4'          3'   2'

|← 8 →|← 7 →|← 8 →|

9   10     11   12   3     2     4     5     13          1

6

|← 8 →|← 7 →|← 8 →|

9   10     11   12   3     2     4     5     13     16   15     1'''

6                                                    14

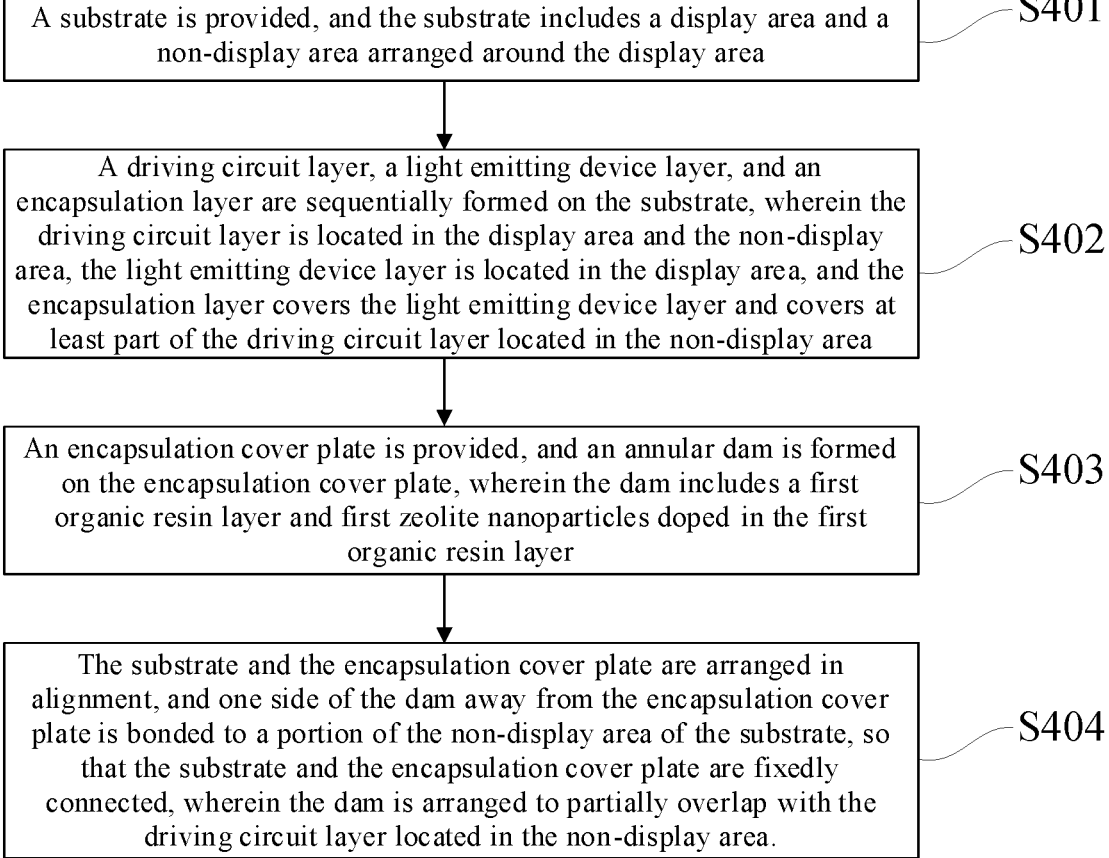

A substrate is provided, and the substrate includes a display area and a non-display area arranged around the display area — S401

A driving circuit layer, a light emitting device layer, and an encapsulation layer are sequentially formed on the substrate, wherein the driving circuit layer is located in the display area and the non-display area, the light emitting device layer is located in the display area, and the encapsulation layer covers the light emitting device layer and covers at least part of the driving circuit layer located in the non-display area — S402

An encapsulation cover plate is provided, and an annular dam is formed on the encapsulation cover plate, wherein the dam includes a first organic resin layer and first zeolite nanoparticles doped in the first organic resin layer — S403

The substrate and the encapsulation cover plate are arranged in alignment, and one side of the dam away from the encapsulation cover plate is bonded to a portion of the non-display area of the substrate, so that the substrate and the encapsulation cover plate are fixedly connected, wherein the dam is arranged to partially overlap with the driving circuit layer located in the non-display area. — S404

FIG. 4

DISPLAY PANEL AND MANUFACTURING METHOD THEREOF

TECHNICAL FIELD

The present disclosure relates to the display technology field, and more particularly to a display panel and a manufacturing method thereof.

BACKGROUND ART

Currently, organic light emitting diodes (OLED) are display devices which have attracted much attention due to their characteristics of self-luminescence, high contrast, fast response speed, thinness, and being capable of being manufactured as a flexible display. Luminescent materials, functional materials, and cathode materials in OLED devices are extremely sensitive to water and oxygen, so encapsulation is required to protect the OLED devices.

In response to the market's demand for a narrow bezel, an OLED panel can adopt Gate Driver on Array (GOA) design and an extremely narrow packaging structure to reduce the bezel. As shown in FIG. 1, a conventional rigid packaging structure of a top emission GOA OLED panel 1' consists of a dam 2', a moisture absorption agent (getter) 3', a filling glue (filler) 4', and an encapsulation layer 5'. An objective of the dam 2' is used for bonding a substrate 6' and an encapsulation cover plate 7' and blocking intrusion of water vapor and oxygen around. The moisture absorption agent 3' can absorb a large amount of infiltrating water vapor to improve packaging effect. The filling glue 4' is used for supporting the encapsulation cover plate 7' and avoiding cracking of the encapsulation layer 5' during vibration. The filling glue 4' has high transmittance, so that a light output of an OLED device layer 8' is not affected. The encapsulation layer 5' can block a small amount of infiltrating water and oxygen and isolate organic impurity gas (outgas) released by the filling glue 4', so as to avoid damage to cathodes and luminescent materials of the OLED device layer 8'.

Currently, in order to further reduce the bezel of the GOA OLED panel, the moisture absorption agent can be added in the dam, which can not only reduce an encapsulation area, but also ensure barrier performance. Furthermore, overlapping the dam with the GOA circuit can also reduce the panel bezel. However, the moisture absorption agent usually uses alkali metal oxides, such as calcium oxide (CaO). During a reliability (RA) test process of high-temperature and high-humidity storage, after absorbing water, the moisture absorption agent doped with the alkali metal material in the dam causes threshold voltages (Vth) of TFTs in the GOA circuit to drift negatively. As such, the GOA circuit fails. Moreover, the moisture absorption agent doped with the alkali metal material in the dam increases an expansion coefficient greatly. This affects bonding effect of the dam on the substrate and the encapsulation cover plate.

SUMMARY OF DISCLOSURE

The present disclosure provides a display panel and a manufacturing method thereof capable of blocking water and oxygen effectively, ensuring normal functions of the driving circuit layer, improving bonding effect of the dam, and avoiding damage to the driving circuit layer due to expansion stress while a bezel of the panel is narrowed.

The present disclosure provides a display panel including a substrate and an encapsulation cover plate which are arranged opposite to each other, a driving circuit layer and a light emitting device layer which are sequentially arranged on one side of the substrate close to the encapsulation cover plate, and a dam interposed between the substrate and the encapsulation cover plate;

wherein the display panel has a display area and a non-display area arranged around the display area, the light emitting device layer is located in the display area, the driving circuit layer is located in the display area and the non-display area, and the dam is located in the non-display area and arranged around the display area; and wherein two sides of the dam in a direction perpendicular to the display panel are bonded to the substrate and the encapsulation cover plate, the dam partially overlaps with the driving circuit layer located in the non-display area, and the dam includes a first organic resin layer and first zeolite nanoparticles doped in the first organic resin layer.

Optionally, a material of the first zeolite nanoparticles includes any one of crystalline porous aluminosilicate, crystalline porous aluminophosphate, and crystalline porous silicoaluminophosphate; and wherein a particle diameter of each of the first zeolite nanoparticles is greater than 10 nm and less than or equal to 150 nm, and a mass fraction of the first zeolite nanoparticles in the dam is greater than 0% and less than or equal to 50%.

Optionally, the driving circuit layer includes a GOA circuit located in the non-display area, and the dam is arranged to partially overlap with the GOA circuit.

Optionally, the display panel further includes an encapsulation layer covering the light emitting device layer, the encapsulation layer further covers at least part of the driving circuit layer located in the non-display area, and the dam partially covers the encapsulation layer.

Optionally, the encapsulation layer includes at least one inorganic encapsulation layer, or the encapsulation layer includes a first inorganic encapsulation layer, an organic encapsulation layer, and a second inorganic encapsulation layer which are sequentially stacked.

Optionally, the display panel further includes a getter insulating layer located on the encapsulation layer and a filling glue filled between the getter insulating layer and the encapsulation cover plate, and the dam is arranged around the getter insulating layer and the filling glue; and wherein the getter insulating layer includes a second organic resin layer and second zeolite nanoparticles doped in the second organic resin layer.

Optionally, a thickness of the getter insulating layer is less than 5 μm, a particle diameter of each of the second zeolite nanoparticles is less than a wavelength of any one visible light, and a mass fraction of the second zeolite nanoparticles in the getter insulating layer is greater than 0% and less than or equal to 20%.

Optionally, the mass fraction of the second zeolite nanoparticles in the getter insulating layer is greater than 0% and less than or equal to 10%.

The present disclosure further provides a manufacturing method of a display panel including following steps:

providing a substrate, wherein the substrate has a display area and a non-display area arranged around the display area;

forming a driving circuit layer, a light emitting device layer, and an encapsulation layer on the substrate sequentially, wherein the driving circuit layer is located in the display area and the non-display area, the light emitting device layer is located in the display area, and the encapsulation layer covers the light emitting device layer and covers at least part of the driving circuit layer located in the non-display area;

providing an encapsulation cover plate, and forming an annular dam on the encapsulation cover plate, wherein the dam includes a first organic resin layer and first zeolite nanoparticles doped in the first organic resin layer; and arranging the substrate and the encapsulation cover plate in alignment, and bonding one side of the dam away from the encapsulation cover plate to a portion of the non-display area of the substrate, so that the substrate and the encapsulation cover plate are fixedly connected, wherein the dam is arranged to partially overlap with the driving circuit layer located in the non-display area.

Optionally, before the substrate and the encapsulation cover plate are fixedly connected, the manufacturing method further includes a step of:

forming a getter insulating layer and a filling glue on the encapsulation layer sequentially, wherein the getter insulating layer includes a second organic resin layer and second zeolite nanoparticles doped in the second organic resin layer; and after the substrate and the encapsulation cover plate are fixedly connected, the dam is arranged around the getter insulating layer and the filling glue.

In the display panel and the manufacturing method thereof, the dam includes the first organic resin layer and the first zeolite nanoparticles doped in the first organic resin layer, and the dam is arranged to partially overlap with the driving circuit layer in the non-display area. Since each of the first zeolite nanoparticles has a porous structure and each of the first zeolite nanoparticles is formed by connecting multiple composite units, each of the first zeolite nanoparticles has a regular tubular pore channel and cavity structure. In one aspect, the bezel of the display panel can be narrowed by arrange the dam to partially overlap with the driving circuit layer in the non-display area. In another aspect, the absorption of water and oxygen by the first zeolite nanoparticles is a physical reaction, and no new substances are generated to damage the encapsulation layer. Accordingly, the normal functions of the driving circuit layer are not affected. In yet another aspect, the first zeolite nanoparticles can be filled in the gaps between any two resin molecular chains of the first organic resin layer, which doubles the barrier performance to water and oxygen from the barrier and absorption. In yet another aspect, each of the first zeolite nanoparticles has a stable cavity structure, which can reduce the thermal expansion coefficient and the hygroscopic expansion rate of the dam, improve the bonding effect of the dam on the substrate and the encapsulation cover plate, and avoid that the driving circuit layer in the non-display area is damaged due to the expansion stress.

BRIEF DESCRIPTION OF DRAWINGS

The technical solution and the beneficial effects of the present disclosure are best understood from the following detailed description with reference to the accompanying figures and embodiments.

FIG. 4 illustrates a schematic flowchart of a manufacturing method of a display panel provided by an embodiment of the present disclosure.

DETAILED DESCRIPTION OF EMBODIMENTS

Figure 1:
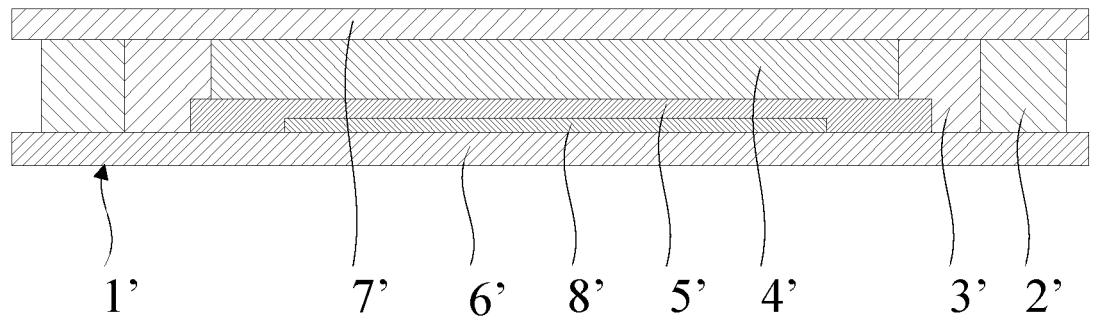
FIG. 1 illustrates a schematic cross-sectional structure diagram of a display panel in the prior art.

The following clearly describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein must have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, the features defined by the term "first" and "second" may include one or more of the features explicitly or implicitly. In the description of the present disclosure, the term "more" refers two or more than two, unless otherwise specifically defined.

In the description of the present disclosure, it should be noted that unless otherwise clearly defined and limited, the terms "mounted", "connected/coupled", and "connection" should be interoperated broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials. However, applications of other processes and/or other materials may be appreciated by those skilled in the art.

The inventor found that a reason that the moisture absorption agent doped with the alkali metal material in the dam causes the threshold voltages Vth of the TFTs in the GOA circuit to drift negatively during the RA test process is that the moisture absorption agent in the dam reacts with water to generate a strong alkali, which produces chemical damage to SiN or SiON in the encapsulation layer. This specifically leads to breaking of Si—N bonds, generation of Si—O, and releases of $NH_3$, $H^+$, and $NH4^+$, which results in migration of H atoms. As such, the threshold voltages Vth of the TFTs in the GOA circuit under the encapsulation layer drift negatively. Furthermore, the moisture absorption agent doped with the alkali metal material in the dam increases an expansion coefficient greatly. This affects the bonding effect of the dam on the substrate.

In order to solve the above-mentioned technical problems, the present disclosure improves the conventional GOA type OLED display panel and specifically refers to the following embodiments.

Figure 2:
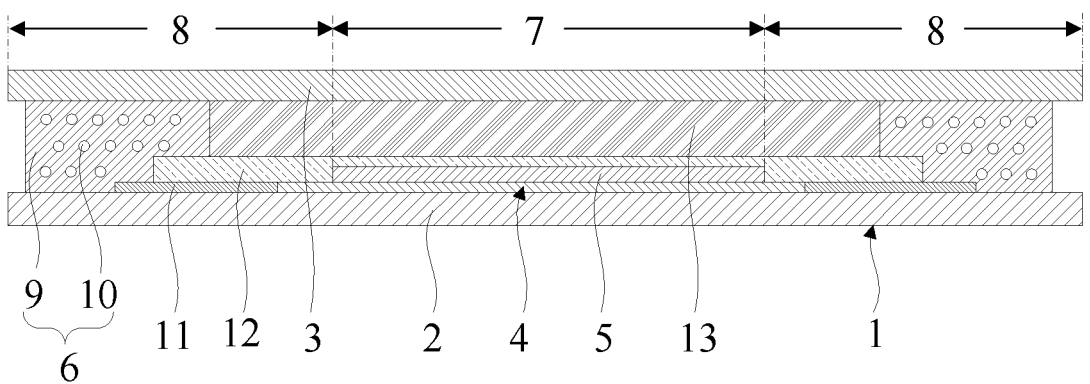
FIG. 2 illustrates a schematic cross-sectional structure diagram of a display panel provided by an embodiment of the present disclosure.

As shown in FIG. 2, an embodiment of the present disclosure provides a display panel 1. The display panel 1 includes a substrate 2 and an encapsulation cover plate 3 which are arranged opposite to each other, a driving circuit layer 4 and a light emitting device layer 5 which are sequentially arranged on one side of the substrate 2 close to the encapsulation cover plate 3, and a dam 6 interposed between the substrate 2 and the encapsulation cover plate 3.

In a specific implementation manner, the substrate 2 includes but is not limited to a glass substrate. The encapsulation cover plate 3 is a protective layer, such as but not limited to a glass cover plate. In a specific implementation manner, a color filter layer can be arranged on one side of the encapsulation cover plate close to the substrate 2.

Specifically, the display panel 1 has a display area 7 and a non-display area 8 arranged around the display area 7. The light emitting device layer 5 is located in the display area 7. The driving circuit layer 4 is located in the display area 7 and the non-display area 8. The dam 6 is located in the non-display area 8 and arranged around the display area 7. It can be understood that the substrate 2 and the encapsulation cover plate 3 are located in the display area 7 and the non-display area 8.

Specifically, two sides of the dam 6 in a direction perpendicular to the display panel 1 are bonded to the substrate 2 and the encapsulation cover plate 3. The dam 6 partially overlaps with the driving circuit layer 4 located in the non-display area 8. The dam 6 includes a first organic resin layer 9 and first zeolite nanoparticles 10 doped in the first organic resin layer 9.

It should be noted that the partial overlapping of the dam 6 and the driving circuit layer 4 mentioned in the present disclosure refers to the partial overlapping of orthographic projections, which do not require substantial contact. For example, the orthographic projection of the dam 6 on the substrate 2 partially overlaps with the orthographic projection of the driving circuit layer 4 located in the non-display area 8 on the substrate 2, and the dam 6 does not necessarily directly contact the driver circuit layer 4 located in the non-display area 8.

In a specific implementation manner, the driving circuit layer 4 includes a GOA circuit 11 located in the non-display area 8 and a driving circuit (not shown in FIG. 2) located in the display area 7. The dam 6 is arranged to partially overlap with the GOA circuit 11. The bezel of the display panel 1 can be narrowed by arrange the dam 6 to partially overlap with the GOA circuit 11. It can be understood that the GOA circuit 11 includes at least one thin film transistor (TFT) and a busline (bus).

Specifically, a material of the first organic resin layer 9 includes but is not limited to any one of acrylic resin and epoxy resin.

Specifically, a material of the first zeolite nanoparticles 10 includes but is not limited to any one of crystalline porous aluminosilicate, crystalline porous aluminophosphate, and crystalline porous silicoaluminophosphate.

Specifically, a particle diameter of each of the first zeolite nanoparticles 10 is greater than 10 nm and less than or equal to 150 nm. A mass fraction of the first zeolite nanoparticles 10 in the dam 6 is greater than 0% and less than or equal to 50%, which does not cause crushing damage to the GOA circuit 11.

In a specific implementation manner, the particle diameter of each of the first zeolite nanoparticles 10 is 100 nm, and the mass fraction of the first zeolite nanoparticles 10 in the dam 6 is 40%. Furthermore, the particle diameter of each of the first zeolite nanoparticles 10 can also be 150 nm, and the mass fraction of the first zeolite nanoparticles 10 in the dam 6 can also be 50%.

It can be understood that the first organic resin layer 9 in the dam 6 is used for bonding the substrate 2 to the encapsulation cover plate 3 and blocking intrusion of water vapor and oxygen around the display panel 1. The first zeolite nanoparticles 10 doped in the first organic resin layer in 9 are used for absorbing a large amount of infiltrating water vapor to enhance packaging effect.

It should be noted that since each of the first zeolite nanoparticles 10 has a porous structure and each of the first zeolite nanoparticles 10 is formed by connecting multiple composite units, each of the first zeolite nanoparticles 10 in the present disclosure has a regular tubular pore channel and cavity structure. In one aspect, the absorption of water and oxygen by the first zeolite nanoparticles 10 is a physical reaction, and no new substances are generated to damage an encapsulation layer 12 of the display panel 1. Accordingly, threshold voltages Vth of TFTs in the GOA circuit 11 are not affected. That is, normal functions of the GOA circuit 11 are not affected. In another aspect, the first zeolite nanoparticles 10 can be filled in gaps between any two resin molecular chains of the first organic resin layer 9, which doubles barrier performance to water and oxygen from the barrier and absorption. In yet another aspect, each of the first zeolite nanoparticles 10 has a stable cavity structure, which can reduce a thermal expansion coefficient and a hygroscopic expansion rate of the dam 6, improve the bonding effect of the dam 6 on the substrate 2 and the encapsulation cover plate 3, and avoid that the TFT devices in the GOA circuit 11 are damaged due to expansion stress.

Specifically, the display panel 1 further includes an encapsulation layer 12 covering the light emitting device layer 5. The encapsulation layer 12 further covers at least part of the driving circuit layer 4 located in the non-display area 8. The dam 6 partially covers the encapsulation layer 12.

It can be understood that the encapsulation layer 12 can partially cover the driving circuit layer 4 located in the non-display area 8, such as covering the GOA circuit 11 partially. The encapsulation layer 12 can further completely cover the driving circuit layer 4 located in the non-display area 8, such as covering the entire GOA circuit 11. When the encapsulation layer 12 partially covers the driving circuit layer 4 located in the non-display area 8, the dam 6 partially covers the driving circuit layer 4 and the encapsulation layer 12 located in the non-display area 8. When the encapsulation layer 12 completely covers the driving circuit layer 4 located in the non-display area 8, the dam 6 only partially covers the encapsulation layer 12. FIG. 2 only illustrates but is not limited to the case where the encapsulation layer 12 partially covers the driving circuit layer 4 located in the non-display area 8.

Specifically, the encapsulation layer 12 includes at least one inorganic encapsulation layer, such as a single-layer inorganic encapsulation layer or a stack structure formed by multi-layer inorganic encapsulation layers. Alternatively, the encapsulation layer 12 includes a stack structure where a first inorganic encapsulation layer, an organic encapsulation layer, and a second inorganic encapsulation layer are sequentially stacked. When the encapsulation layer 12 is the single-layer inorganic encapsulation layer, both packaging performance and cost can be taken into account. When the encapsulation layer 12 is the stacked structure, the ability of covering foreign matter in manufacturing processes can be improved.

Specifically, the inorganic encapsulation layer (such as the first inorganic encapsulation layer and the second inorganic encapsulation layer) of the encapsulation layer 12 can be manufactured by plasma enhanced chemical vapor deposition or atomic layer deposition. A material of the inorganic encapsulation layer includes at least one of $SiON_x$ and $SiN_x$. The organic encapsulation layer can be coated on the inorganic encapsulation layer by spin coating or inkjet printing.

Specifically, the display panel 1 further includes a filling glue 13 filled between the encapsulation layer 12 and the encapsulation cover plate 3. In a specific implementation manner, a material of the filling glue 13 includes but is not limited to epoxy resin and olefin with high light transmittance.

Specifically, the dam 6 is arranged around the filling glue 13 to prevent the filling glue 13 from overflowing, and the porous structure of each of the first zeolite nanoparticles 10 in the dam 6 can absorb organic impurity gas (outgas) released by a resin material in the first organic resin layer 9 and the filling glue 13 to improve a black spot problem after an RA test.

Specifically, the light emitting device layer 5 includes a plurality of light emitting devices (not shown in FIG. 2). The light emitting devices can be but is not limited to OLED devices or LED devices.

In the embodiment of the present disclosure, the dam 6 is formed by the first organic resin layer 9 and the first zeolite nanoparticles 10 doped in the first organic resin layer 9. The dam 6 is arranged to partially overlap with the driving circuit layer located in the non-display area 8. Since each of the first zeolite nanoparticles 10 has a porous structure and each of the first zeolite nanoparticles 10 is formed by connecting multiple composite units, each of the first zeolite nanoparticles 10 in the present disclosure has a regular tubular pore channel and cavity structure. In one aspect, the bezel of the display panel 1 can be narrowed by arrange the dam 6 to partially overlap with the GOA circuit 11 in the non-display area. In another aspect, the absorption of water and oxygen by the first zeolite nanoparticles 10 is a physical reaction, and no new substances are generated to damage SiN or SiON of the encapsulation layer 12. Accordingly, threshold voltages Vth of the TFTs in the GOA circuit 11 are not affected. That is, the normal functions of the GOA circuit 11 are not affected. In yet another aspect, the first zeolite nanoparticles 10 can be filled in the gaps between any two resin molecular chains of the first organic resin layer 9, which doubles the barrier performance to water and oxygen from the barrier and absorption. In yet another aspect, each of the first zeolite nanoparticles 10 has a stable cavity structure, which can reduce the thermal expansion coefficient and the hygroscopic expansion rate of the dam 6, improve the bonding effect of the dam 6 on the substrate 2 and the encapsulation cover plate 3, and avoid that the TFT devices in the GOA circuit 11 are damaged due to the expansion stress.

Figure 3:
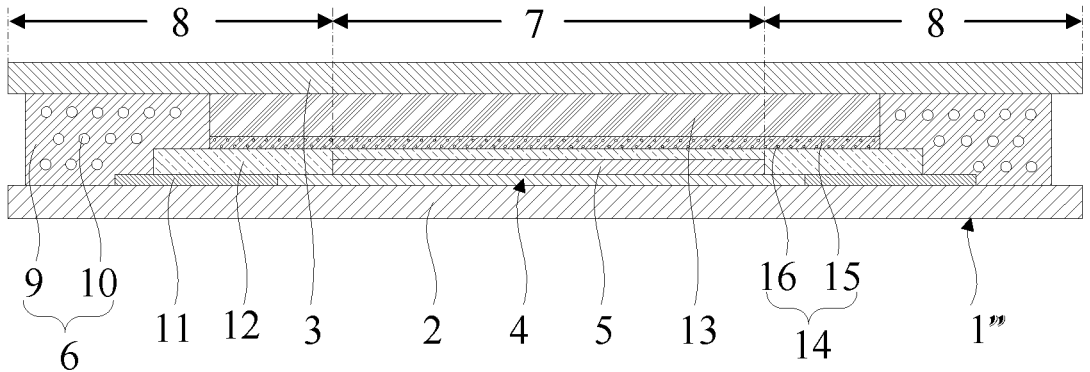
FIG. 3 illustrates a schematic cross-sectional structure diagram of a display panel provided by another embodiment of the present disclosure.

As shown in FIG. 3, an embodiment of the present disclosure further provides a display panel 1″. A difference between the present embodiment and the above-mentioned embodiment is that the display panel 1″ further includes a getter insulating layer 14 located on the encapsulation layer 12. The filling glue 13 is filled between the getter insulating layer 14 and the encapsulation cover plate 3. The dam 6 is arranged around the getter insulating layer 14 and the filling glue 13.

Specifically, the getter insulating layer 14 includes a second organic resin layer 15 and second zeolite nanoparticles 16 doped in the second organic resin layer 15. The getter insulating layer 14 is used for absorbing organic impurity gas (outgas) released by the filling glue 13.

Specifically, a material of the second organic resin layer 15 can be the same as the material of the first organic resin layer 9, but the present disclosure is not limited thereto. A material of the second zeolite nanoparticles 16 can be the same as the material of the first zeolite nanoparticles, but the present disclosure is not limited thereto.

Specifically, a thickness of the getter insulating layer 14 is less than 5 μm. A particle diameter of each of the second zeolite nanoparticles 16 is less than a wavelength of any one visible light.

Specifically, when a mass fraction of the second zeolite nanoparticles 16 in the getter insulating layer 14 is greater than 0% and less than or equal to 20%, light transmittance of the getter insulating layer 14 is greater than 80%. When the mass fraction of the second zeolite nanoparticles 16 in the getter insulating layer 14 is greater than 0% and less than or equal to 10%, the light transmittance of the getter insulating layer 14 is greater than 90%. Accordingly, the arrangement of the getter insulating layer 14 does not affect light output effect of top emission devices.

In a specific implementation manner, the mass fraction of the second zeolite nanoparticles 16 in the getter insulating layer 14 can be 5%, 10%, or 20%.

Specifically, the getter insulating layer 14 can be manufactured by the same process as the encapsulation layer 12. For example, surfaces of the second zeolite nanoparticles 16 are modified and dispersed in a resin material to form an ink, and a film is formed by printing the ink on the encapsulation layer 12 to form the getter insulating layer 14.

Specifically, the dam 6 is manufactured after the getter insulating layer 14 is formed, and the dam 6 can be accurately coated on the non-display area 8 of the substrate 2 by a dispenser (coating machine). Furthermore, an ODF (One Drop Filling, drop injection) method or an inkjet printing method is used for manufacturing the filling glue 13 on the getter insulating layer 14. UV curing is performed on the filling glue 13, and then the filling glue 13 is filled in enclosed space between the getter insulating layer 14 and the encapsulation cover plate 3 by a vacuum alignment lamination process. Certainly, the sequence of the UV curing and the vacuum alignment lamination process can be adjusted. Finally, the dam 6 and the filling glue 13 are thermally cured.

In addition to the advantages of the above-mentioned embodiment, in the embodiment of the present disclosure, the getter insulating layer 14 can effectively absorb the organic impurity gas released by the filling glue 13 through the porous structure of each of the second zeolite nanoparticles 16 without affecting the light transmission performance. Moreover, water and oxygen can be further blocked from the light emitting side.

As shown in FIG. 4, an embodiment of the present disclosure further provides a manufacturing method of any one of the display panels in the above-mentioned embodiments. The manufacturing method includes steps S401 to S404.

In step S401, a substrate is provided, and the substrate has a display area and a non-display area arranged around the display area.

Specifically, the description with respect to the substrate can be referred to the above-mentioned embodiments, and details are not repeated herein.

It should be noted that the display area and the non-display area of the substrate in the embodiment of the present disclosure are respectively arranged correspond to the display area and the non-display area of the display panel in any one of the above-mentioned embodiments.

In step S402, a driving circuit layer, a light emitting device layer, and an encapsulation layer are sequentially formed on the substrate, wherein the driving circuit layer is located in the display area and the non-display area, the light emitting device layer is located in the display area, and the encapsulation layer covers the light emitting device layer and covers at least part of the driving circuit layer located in the non-display area.

In a specific implementation manner, step S402 includes the following steps:

forming a getter insulating layer and a filling glue on the encapsulation layer sequentially, wherein the getter insulating layer includes a second organic resin layer and second zeolite nanoparticles doped in the second organic resin layer.

Specifically, the description with respect to the driving circuit layer, the light emitting device layer, the encapsulation layer, the getter insulating layer, and the filling glue can be referred to the above-mentioned embodiments, and details are not repeated herein.

Specifically, the driving circuit layer located in the non-display area includes a GOA circuit.

Specifically, an inorganic encapsulation layer of the encapsulation layer can be manufactured by plasma enhanced chemical vapor deposition or atomic layer deposition. A material of the inorganic encapsulation layer includes at least one of $SiON_x$ and $SiN_x$. The inorganic encapsulation layer partially or completely covers the GOA circuit. When the encapsulation layer is formed by a first inorganic encapsulation layer, an organic encapsulation layer, and a second inorganic encapsulation layer, the organic encapsulation layer of the encapsulation layer can be formed on the first inorganic encapsulation layer by spin coating or inkjet printing.

Specifically, the getter insulating layer can be manufactured by the same process as the encapsulation layer. For example, surfaces of the second zeolite nanoparticles are modified and dispersed in a resin material to form an ink, and a film is formed on the inorganic encapsulation layer (e.g., the second inorganic encapsulation layer) to form the getter insulating layer.

Specifically, an ODF (One Drop Filling, drop injection) method or an inkjet printing method is used for manufacturing the filling glue on the getter insulating layer. A UV (ultraviolet) light curing treatment is performed on the filling glue 13. Certainly, in other implementation manners, the manufacturing and curing operations of the filling glue can be performed in step S403. That is, the filling glue is formed on an encapsulation cover plate.

In step S403, an encapsulation cover plate is provided, and an annular dam is formed on the encapsulation cover plate, wherein the dam includes a first organic resin layer and first zeolite nanoparticles doped in the first organic resin layer.

Specifically, the dam is precisely coated by a dispenser (dispensing glue), or it can also be cured by UV light.

Specifically, in other embodiment, the dam can also be formed on the substrate to connect the encapsulation cover plate, the description with respect to the dam can be referred to the above-mentioned embodiments, and details are not repeated herein.

In step S404, the substrate and the encapsulation cover plate are arranged in alignment, and one side of the dam away from the encapsulation cover plate is bonded to a portion of the non-display area of the substrate, so that the substrate and the encapsulation cover plate are fixedly connected, wherein the dam is arranged to partially overlap with the driving circuit layer located in the non-display area.

Specifically, in step S404, the filling glue is filled in enclosed space between the getter insulating layer and the encapsulation cover plate by a vacuum alignment lamination process, and the dam is arranged around the getter insulating layer and the filling glue.

Specifically, step S404 includes the following steps:

performing a thermal curing treatment on the dam and
    filling glue.

Specifically, a positional relationship of the dam and other membrane structures can be referred to the above-mentioned embodiments, and details are not repeated herein.

The display panel manufactured by the manufacturing method provided by the embodiment of the present disclosure has the following advantages. In one aspect, a bezel of the display panel can be narrowed by arrange the dam to partially overlap with the GOA circuit in the non-display area. In another aspect, the absorption of water and oxygen by the first zeolite nanoparticles is a physical reaction, and no new substances are generated to damage SiN or SiON of the encapsulation layer. Accordingly, threshold voltages Vth of TFTs in the GOA circuit are not affected. That is, normal functions of the GOA circuit are not affected. In yet another aspect, the first zeolite nanoparticles 10 can be filled in gaps between any two resin molecular chains of the first organic resin layer, which doubles the barrier performance to water and oxygen from the barrier and absorption. In yet another aspect, each of the first zeolite nanoparticles has a stable cavity structure, which can reduce a thermal expansion coefficient and a hygroscopic expansion rate of the dam, improve bonding effect of the dam on the substrate and the encapsulation cover plate, and avoid that the TFT devices in the GOA circuit are damaged due to expansion stress. In yet another embodiment, the getter insulating layer can effectively absorb organic impurity gas released by the filling glue through the porous structure of each of the second zeolite nanoparticles without affecting the light transmission performance. Moreover, water and oxygen can be further blocked from a light emitting side.

The descriptions of the above-mentioned embodiments have different emphasis, and as for parts that are not described in detail in one embodiment, reference can be made to the relevant descriptions of other embodiments.

A display panel and a manufacturing method thereof provided by the embodiments of the present disclosure are introduced in detail above. The principles and implementations of the present disclosure are illustrated through some embodiments. However, the descriptions of the above-mentioned embodiments are only used to help understand the technical solutions and core ideas of the present disclosure. Those skilled in the art should understand that they can still make modifications to the technical solutions described in the above-mentioned embodiments or make equivalent replacements to some technical features thereof, as long as such modifications or replacements do not cause the essence of corresponding technical solutions to depart from the spirit and scope of the technical solutions of the embodiments of the present disclosure.

What is claimed is:

1. A display panel, comprising a substrate and an encapsulation cover plate which are arranged opposite to each other, a driving circuit layer and a light emitting device layer which are sequentially arranged on one side of the substrate close to the encapsulation cover plate, and a dam interposed between the substrate and the encapsulation cover plate;

wherein the display panel has a display area and a non-display area arranged around the display area, the light emitting device layer is located in the display area, the driving circuit layer is located in the display area and the non-display area, and the dam is located in the non-display area and arranged around the display area;

wherein two sides of the dam in a direction perpendicular to the display panel are bonded to the substrate and the encapsulation cover plate, the dam partially overlaps with the driving circuit layer located in the non-display area, and the dam comprises a first organic resin layer and first zeolite nanoparticles doped in the first organic resin layer;

wherein the display panel further comprises an encapsulation layer covering the light emitting device layer, the encapsulation layer further covers at least part of the driving circuit layer located in the non-display area, and the dam partially covers the encapsulation layer, and wherein the display panel further comprises a getter insulating layer located on the encapsulation layer and a filling glue filled between the getter insulating layer and the encapsulation cover plate, and the dam is arranged around the getter insulating layer and the filling glue; and wherein the getter insulating layer comprises a second organic resin layer and second zeolite nanoparticles doped in the second organic resin layer.

2. The display panel of claim 1, wherein a material of the first zeolite nanoparticles comprises any one of crystalline porous aluminosilicate, crystalline porous aluminophosphate, and crystalline porous silicoaluminophosphate.

3. The display panel of claim 1, wherein a particle diameter of each of the first zeolite nanoparticles is greater than 10 nm and less than or equal to 150 nm.

4. The display panel of claim 1, wherein a mass fraction of the first zeolite nanoparticles in the dam is greater than 0% and less than or equal to 50%.

5. The display panel of claim 1, wherein the driving circuit layer comprises a GOA circuit located in the non-display area, and the dam is arranged to partially overlap with the GOA circuit.

6. The display panel of claim 1, wherein the encapsulation layer comprises at least one inorganic encapsulation layer.

7. The display panel of claim 1, wherein the encapsulation layer comprises a first inorganic encapsulation layer, an organic encapsulation layer, and a second inorganic encapsulation layer which are sequentially stacked.

8. The display panel of claim 1, wherein a thickness of the getter insulating layer is less than 5 μm.

9. The display panel of claim 1, wherein a particle diameter of each of the second zeolite nanoparticles is less than a wavelength of any one visible light.

10. The display panel of claim 1, wherein a mass fraction of the second zeolite nanoparticles in the getter insulating layer is greater than 0% and less than or equal to 20%.

11. The display panel of claim 10, wherein the mass fraction of the second zeolite nanoparticles in the getter insulating layer is greater than 0% and less than or equal to 10%.

12. A manufacturing method of a display panel, comprising following steps:

providing a substrate, wherein the substrate has a display area and a non-display area arranged around the display area;

forming a driving circuit layer, a light emitting device layer, and an encapsulation layer on the substrate sequentially, wherein the driving circuit layer is located in the display area and the non-display area, the light emitting device layer is located in the display area, and the encapsulation layer covers the light emitting device layer and covers at least part of the driving circuit layer located in the non-display area;

providing an encapsulation cover plate, and forming an annular dam on the encapsulation cover plate, wherein the dam comprises a first organic resin layer and first zeolite nanoparticles doped in the first organic resin layer;

forming a getter insulating layer and a filling glue on the encapsulation layer sequentially, wherein the getter insulating layer comprises a second organic resin layer and second zeolite nanoparticles doped in the second organic resin layer; and arranging the substrate and the encapsulation cover plate in alignment, and bonding one side of the dam away from the encapsulation cover plate to a portion of the non-display area of the substrate, so that the substrate and the encapsulation cover plate are fixedly connected, wherein the dam is arranged to partially overlap with the driving circuit layer located in the non-display area.

13. The manufacturing method of the display panel of claim 12, wherein after the substrate and the encapsulation cover plate are fixedly connected, the dam is arranged around the getter insulating layer and the filling glue.

14. A manufacturing method of a display panel, comprising following steps:

providing a substrate and forming an annular dam on the encapsulation cover plate, wherein the substrate has a display area and a non-display area arranged around the display area, and the dam comprises a first organic resin layer and first zeolite nanoparticles doped in the first organic resin layer;

forming a driving circuit layer, a light emitting device layer, and an encapsulation layer on the substrate sequentially, wherein the driving circuit layer is located in the display area and the non-display area, the light emitting device layer is located in the display area, and the encapsulation layer covers the light emitting device layer and covers at least part of the driving circuit layer located in the non-display area;

providing an encapsulation cover plate;

forming a getter insulating layer and a filling glue on the encapsulation layer sequentially, wherein the getter insulating layer comprises a second organic resin layer and second zeolite nanoparticles doped in the second organic resin layer; and arranging the substrate and the encapsulation cover plate in alignment, and bonding one side of the dam away from the encapsulation cover plate to a portion of the non-display area of the substrate, so that the substrate and the encapsulation cover plate are fixedly connected, wherein the dam is arranged to partially overlap with the driving circuit layer located in the non-display area.

15. The manufacturing method of the display panel of claim 14, wherein after the substrate and the encapsulation cover plate are fixedly connected, the dam is arranged around the getter insulating layer and the filling glue.

\* \* \* \* \*